(12) United States Patent
Meninger et al.

(10) Patent No.: US 9,470,719 B2
(45) Date of Patent: Oct. 18, 2016

(54) TESTING SEMICONDUCTOR DEVICES

(71) Applicant: Cavium, Inc., San Jose, CA (US)

(72) Inventors: Scott E. Meninger, Groton, MA (US);
Jonathan K. Brown, Brookline, MA (US); Rohan Arora, Marlborough, MA (US)

(73) Assignee: Cavium, Inc., San Jose, CA (US)

( * ) Notice: Subject to any disclaimer, the term of this patent is extended or adjusted under 35 U.S.C. 154(b) by 186 days.

(21) Appl. No.: 14/541,977

(22) Filed: Nov. 14, 2014

(65) Prior Publication Data

US 2016/0139180 A1 May 19, 2016

(51) Int. Cl.
*G01R 31/28* (2006.01)
*G01R 1/20* (2006.01)
*G01R 31/02* (2006.01)
*G01R 31/26* (2014.01)

(52) U.S. Cl.
CPC .............. *G01R 1/20* (2013.01); *G01R 31/025* (2013.01); *G01R 31/2601* (2013.01)

(58) Field of Classification Search
CPC ............... G01R 31/2834; G01R 31/31705; G01R 31/31707; G01R 31/3183; G01R 31/318307; G01R 31/318392; G01R 31/318522
See application file for complete search history.

(56) References Cited

U.S. PATENT DOCUMENTS

| 5,841,294 A | 11/1998 | Jang et al. |
| 6,011,403 A | 1/2000 | Gillette |
| 8,214,777 B2 | 7/2012 | Joshi et al. |
| 8,525,572 B2 | 9/2013 | Lin |
| 2006/0066316 A1* | 3/2006 | Rozen ............... G01R 31/2621 324/601 |
| 2008/0111616 A1* | 5/2008 | Cheng ............... G01R 31/3008 327/543 |
| 2014/0133249 A1 | 5/2014 | Yamada |

* cited by examiner

*Primary Examiner* — Tung X Nguyen
(74) *Attorney, Agent, or Firm* — Occhiuti & Rohlicek LLP

(57) ABSTRACT

An apparatus includes a plurality of semiconductor devices and an electrical input device for applying voltage to the plurality of semiconductor devices. There is a switching array configured to sequentially interconnect the electrical input device to each of the semiconductor devices and disconnect the other semiconductor devices from the electrical input device. The semiconductor device connected to the electrical input device is a device under test that produces a test current and the other semiconductor devices are devices not under test that produce, in the aggregate, a leakage current. There is an output node interconnected to the switching array for enabling the measurement of the test current at the output node. There is also a leakage current compensator connected to the output node and the switching array that is configured to divert the leakage current away from the output node.

25 Claims, 5 Drawing Sheets

TESTING SEMICONDUCTOR DEVICES

BACKGROUND

The invention relates to testing a plurality of semiconductor devices, and more specifically to testing semiconductor devices on an integrated circuit.

The fabrication of integrated circuits (ICs) is imperfect and subtle changes in the fabrication process will change the performance of the ICs across wafers and batches from the foundry. To monitor and characterize these changes in the process, on-chip circuitry is useful. Accurate measurement of on-chip components typically requires several pins at the IC boundary for calibration purposes. The use of several pins, however, increases IC area while also increasing package and printed circuit board (PCB) complexity. If area and system complexity increase, then the associated system costs could rise as well.

SUMMARY

In one aspect, in general, an apparatus includes a plurality of semiconductor devices and an electrical input device for applying voltage to the plurality of semiconductor devices. There is a switching array configured to sequentially interconnect the electrical input device to each of the plurality of semiconductor devices and to disconnect the other semiconductor devices from the electrical input device. There is a semiconductor device connected to the electrical input device, designated as a device under test, that produces a test current and the other semiconductor devices, designated as the devices not under test, that, in the aggregate, produce a leakage current. There is also an output node interconnected to the switching array for enabling the measurement of the test current at the output node. Further, there is a leakage current compensator connected to the output node and the switching array, the leakage current compensator configured to divert the leakage current away from the output node.

Aspects can include one or more of the following features. The plurality of semiconductor devices comprise at least one of transistors, diodes, or resistors. The electrical input device includes a passive digital-to-analog converter. The switching array includes, for each of the plurality of semiconductor devices, a first switch for connecting a first terminal of a semiconductor device to the electrical input device and a second switch for connecting a second terminal of a semiconductor device to the output node. The first and second switches of the device under test are closed to connect the first terminal of the device under test to the electrical input device and the second terminal of the device under test to the output node, and the first and second switches of said devices not under test are opened to disconnect the first terminal of each of the devices not under test from said electrical input device and to disconnect the second terminal of each of the devices not under test from said output node. The devices not under test are disabled by applying a predetermined voltage to the first terminals of said devices not under test.

Other aspects can include one or more of the following features. The switching array further includes a switch for connecting the leakage current compensator to the second terminal of each of said plurality of semiconductor devices. The switch for connecting the leakage current compensator to the device under test is opened to disconnect the leakage current compensator from the second terminal of the device under test and the switches for connecting the leakage current compensator to the devices not under test are closed to connect the leakage current compensator to the second terminals of the devices not under test. The leakage current compensator is configured to maintain a voltage at the second terminals of the devices not under test close to a voltage at the output node. The leakage current compensator includes a voltage follower circuit configured to maintain the voltage at the second terminals of the devices not under test close to the voltage at the output node.

Further aspects can include one or more of the following features. The voltage follower circuit includes an operational amplifier with its non-inverting terminal connected to the output node and both the inverting terminal and the output connected to the switching array. The switching array further includes an uncompensated leakage current circuit that comprises a switch connected between the output node and an open circuit terminal. There is a measurement device connected to the output node, wherein the measurement device is configured to measure an uncompensated leakage current at the output node when the switch of the uncompensated leakage current circuit is closed. The switching array further includes an electrical input device switch for connecting the electrical input device to the output node, wherein the electrical input device is configured to apply voltages in a test mode to the output node. There is also included a measurement circuit connected to the output node configured to measure the voltages and currents at the output node and configured to measure nonlinearities associated with the electrical input device. The leakage current compensator includes a voltage follower circuit configured maintain a voltage at terminals of the devices not under test close to a voltage at the output node.

In another aspect, there is a method for testing a plurality of semiconductor devices includes sequentially applying voltage from an electrical input device to each of the plurality of semiconductor devices, a semiconductor device to which voltage is applied being a device under test, the device under test producing a test current. The method includes preventing voltage from being applied by the electrical input device to other semiconductor devices not under test, the devices not under test producing, in the aggregate, a leakage current. The method also includes receiving the test current for measurement at an output node; and diverting the leakage current away from the output node.

Aspects can include a plurality of semiconductor devices with at least one of transistors, diodes, or resistors. The method also includes sequentially applying voltage from the electrical input device and preventing voltage from being applied by the electrical input device to the semiconductor devices not under test. This method comprises operating a plurality of switches including, for each of said plurality of semiconductor devices, a first switch for connecting a first terminal of a semiconductor device to the electrical input device and a second switch for connecting a second terminal of a semiconductor device to the output node. The method further includes closing the first and second switches of the device under test to connect the first terminal of the device under test to the electrical input device and the second terminal of the device under test to the output node and opening the first and second switches of the devices not under test to disconnect the first terminal of each of the devices not under test from the electrical input device and the second terminal of each of the devices not under test from the output node.

Other aspects can include operating a switch connected to the leakage current compensator and to the second terminal of each of said plurality of semiconductor devices, the operating including opening the switch to disconnect the leakage current compensator from the second terminal of the device under test and closing the switches for connecting the leakage current compensator to the devices not under test. The method includes disabling the devices not under test by applying a predetermined voltage to the first terminals of said devices not under test and causing the leakage current compensator to maintain a voltage at the second terminals of the devices not under test close to a voltage at the output node, thereby diverting the leakage current away from the output node.

Further aspects can include determining an uncompensated leakage current and measuring the test current and subtracting from the test current the uncompensated leakage current. The method includes connecting the electrical input device to the output node, and with the electrical input device applying voltages to the output node, measuring the voltages and currents at the output node, and from the measured voltages determining if there are nonlinearities associated with the electrical input device. The method also includes diverting the leakage current away from the output node includes maintaining a voltage at terminals of the devices not under test close to a voltage at the output node.

Aspects can have one or more of the following advantages.

The process characterization block described herein is able to carry out accurate measurements from a single output pin in order to reduce system costs and complexity. The use of a passive digital to analog converter, as described in more detail below, also helps to avoid the need for an additional pin on the IC. The calibration process described herein also helps to further increase the accuracy of the measurements from the single output pin.

Other features and advantages of the invention will become apparent from the following description, and from the claims.

DESCRIPTION

Figure 1:
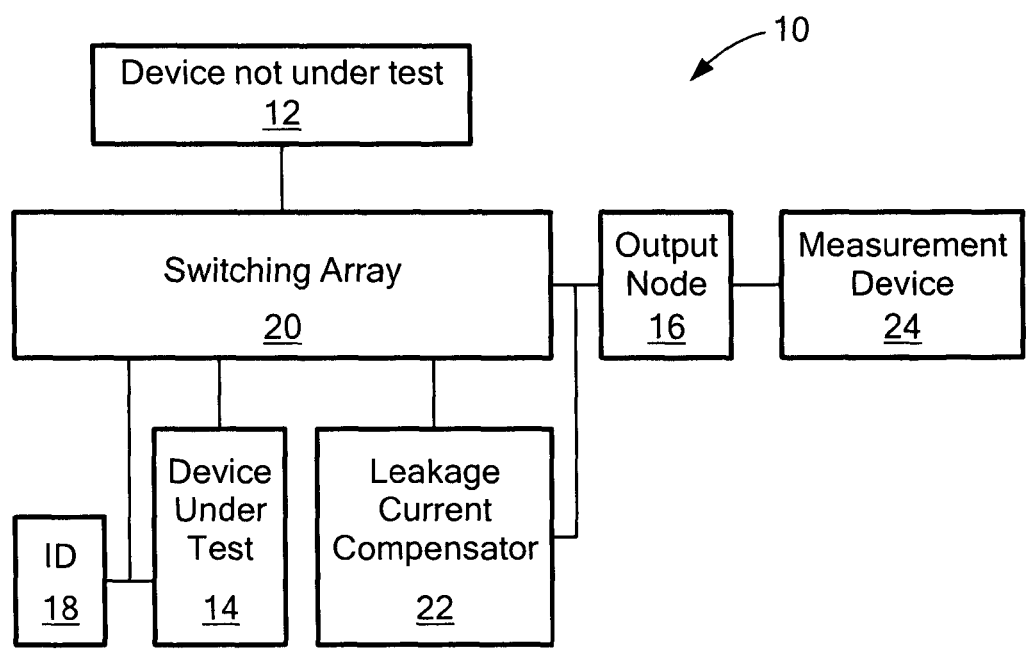
FIG. 1 is a block diagram of a circuit for testing a plurality of semiconductor devices.

FIG. 1 depicts an example of a circuit 10 for testing a plurality of semiconductor devices shown in the aggregate as devices not under test 12 and a device under test 14. Circuit 10 is implemented on an integrated circuit (IC) so that the performance of the semiconductor devices on the IC may be tested to ensure proper performance as changes in the fabrication process will change the performance of the ICs across wafers and batches from the foundry. To monitor and characterize these changes in the process, on-chip circuitry is used. The devices to be tested may be any kind of semiconductor devices, such as field effect transistors, bipolar junction transistors, diodes, and/or resistors, as well as the different varieties of such devices like MOSFETs, JFETs, n-doped and p-doped FETs, and devices with different physical parameters, such as different gate lengths and widths. Typically, the devices to be tested will represent the full range of devices implemented on the IC. The semiconductor devices in circuit 10 are, in some embodiments, dedicated to testing and do not form part of the actual functional circuitry for which the IC was fabricated.

Accurate measurement of on-chip components typically requires several pins at the IC boundary for calibration purposes. The use of several pins, however, increases IC area while also increasing package and printed circuit board (PCB) complexity. A PCB, such as a motherboard for a computing device, typically has an interface (e.g., a socket) for mechanically receiving an IC and electrically coupling (via pins) to an electrical interface included as part of the IC. This electrical interface may be metal pad to which the pins are connected via bonding wires or via solder bumps. In circuit 10 there is only required a single output node 16 (e.g., an output pad consisting of a conducting material within the IC) that is dedicated to the accurate measurement of electrical performance of the semiconductor devices to be tested. Of course, there will also be a number of other output or input nodes for coupling to the operational devices of the IC (i.e., devices not dedicated to the measurement of the testing semiconductor devices). Each of the plurality of semiconductor devices is sequentially interconnected to an electrical input device (ID) 18 and to the output node 16 by a switching array 20 to enable that device to undergo testing. This device is designated as the device under test or DUT. The switching array 20 disconnects the other semiconductor devices from the electrical input device 18 and the output node 16 and these semiconductor devices are designated as the devices not under test 12. This process continues until all devices are tested.

Electrical input device 18 is used to apply a voltage to a terminal, such as the gate in an FET or the base in a BJT, of the device under test 14 to activate the device for testing. Electrical input device 18 is typically implemented as a digital-to-analog converter (DAC) and may be configured as a passive DAC such as a resistor ladder network referenced to the on-chip supply voltage to eliminate the need for an additional pin on the IC.

For testing each semiconductor device, the voltage applied by ID 18 to the gate/base terminal is swept from 0V to supply voltage. The drain voltage is also swept from 0V to supply voltage by the measurement device 24. A set of measurements of the output current may then be taken for each device at the output node 16 for the various gate and drain voltages to assess the device performance.

With only the device under test 14 enabled (i.e., driven by the ID 18) and connected to the output node 16, theoretically (without any real-world non-idealities) the output current should only consist of the test current from the device under test 14. However, even though the devices not under test 12 are disconnected and disabled by the switching array 20 they do, in the aggregate, produce a leakage current, which appears at the output node 16. This is because the switches in the switching array have very high impedances but they are not infinite and therefore there is some current that is leaked from each of the devices not under test even though they are turned off by connecting the gate terminal to supply rail. The output current is thus not just the test current, but it is the sum of the test current and the leakage current. While the leakage current for each individual device is small, when there are hundreds of devices to be tested, the aggregate leakage current can significantly reduce the measurement accuracy of the test current for the device under test.

In order to improve the measurement accuracy of the test current, circuit 10 includes leakage current compensator 22, which diverts the leakage current from the output node 16 by providing an alternate path for the leakage current. The output current is measured at the output node 16 by a measurement device 24. With the leakage current diverted from the output node 16, the output current would be the current from the device under test.

Figure 2:
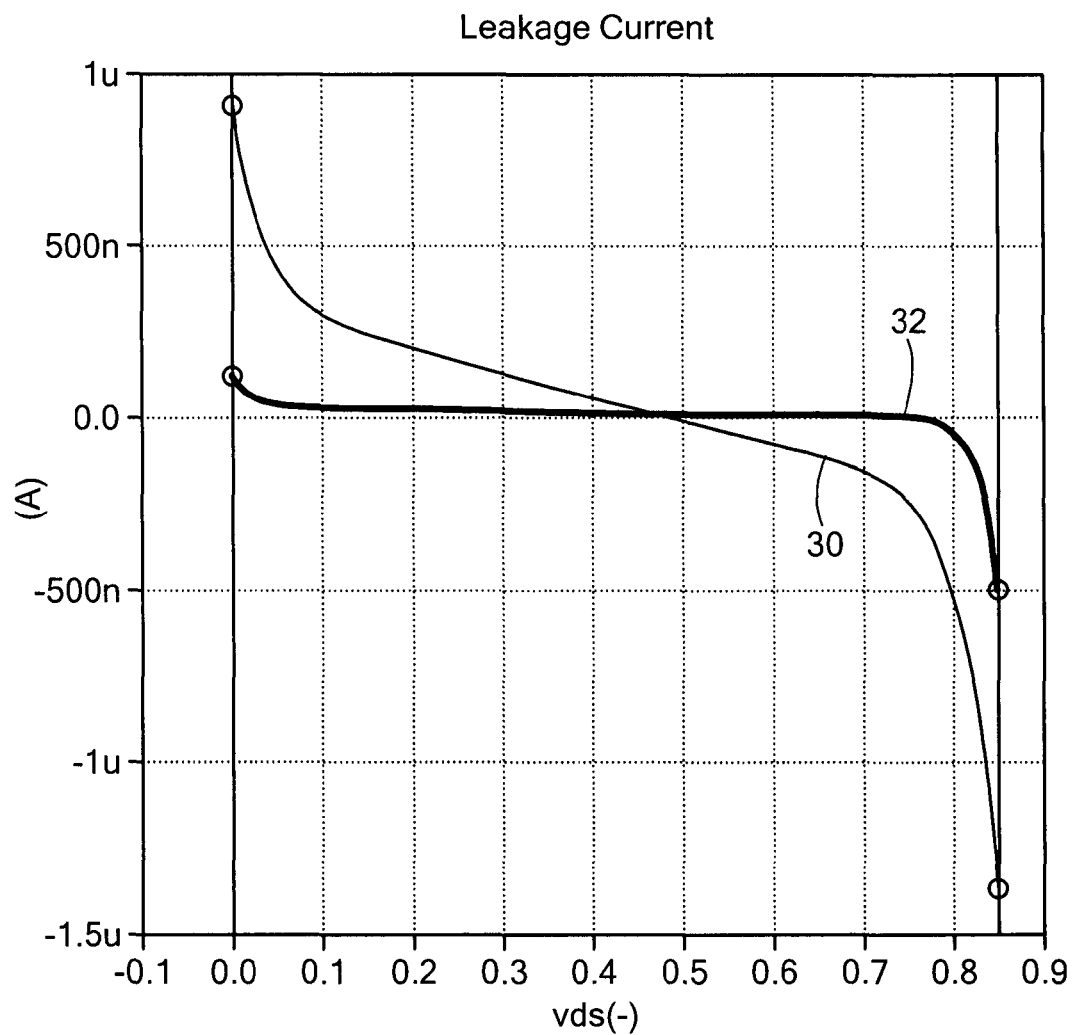
FIG. 2 is a plot of output current versus drain to source voltage for a device under test with and without the leakage current compensator.

To depict the benefit of leakage current compensator 22, output current 30, FIG. 2, without use of the leakage current compensator 22 in circuit 10, is plotted against output current 32, which is the output current with the leakage current compensator in circuit 10. The plot is the current at output node 16 for output voltage levels swept over the entire range of the on-chip supply at a given gate voltage. The leakage current compensator 22, results in the diversion of a significant amount of leakage current, which is evident by the reduced levels of current in output current plot 32 (with leakage current compensator) relative to output current 30 (without leakage current compensator). This results in improved measurement accuracy of the circuit 10.

Figure 3:
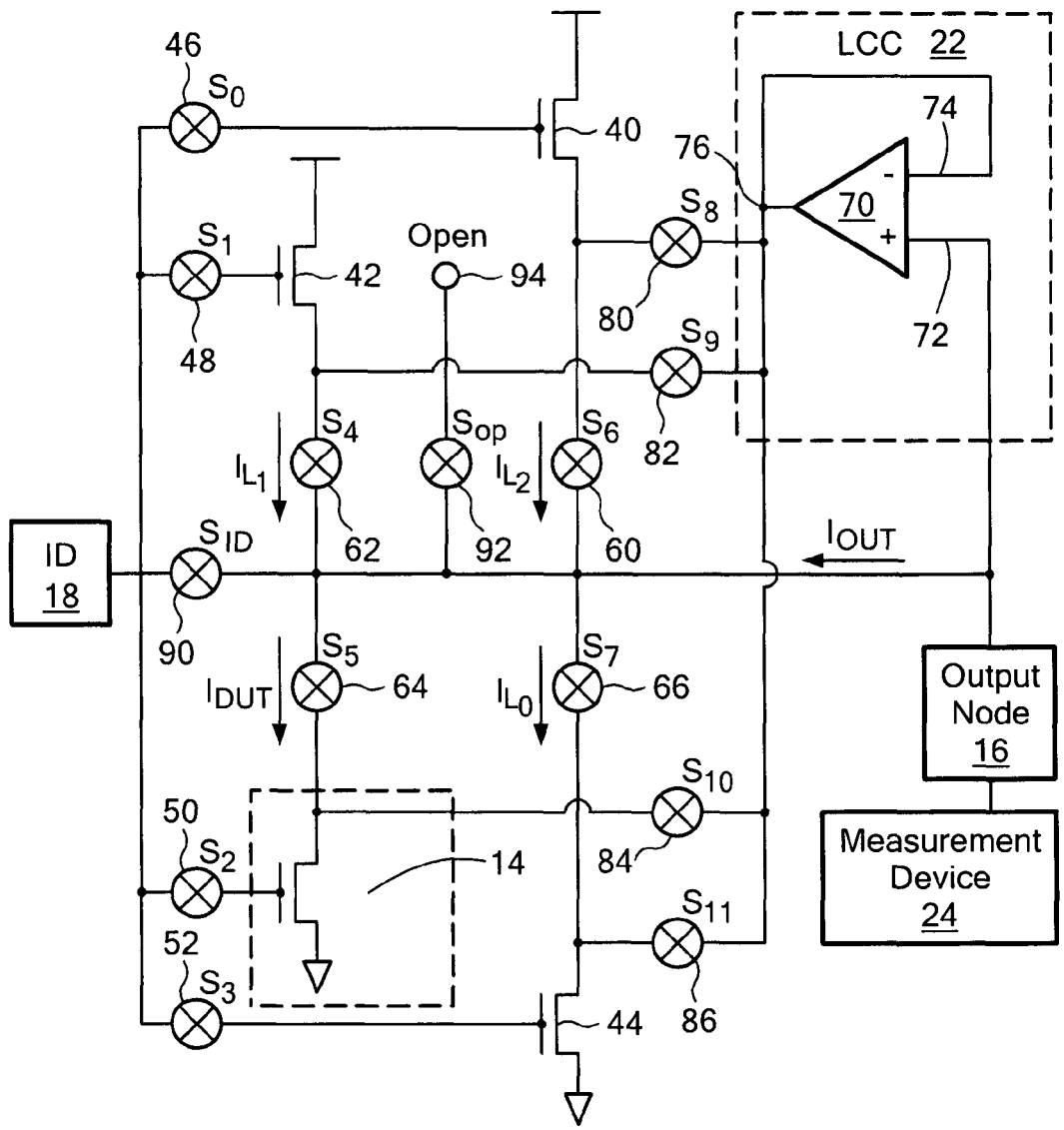
FIG. 3 is a schematic block diagram of the circuit for testing a plurality of semiconductor devices.

Circuit 10 is shown in more detail in FIG. 3. The device under test 14 is shown in this example as a FET. Devices not under test are FETs 40, 42, and 44. After device under test 14 has been tested the other devices 40, 42, and 44 will each be tested sequentially and will become the device under test while the remaining devices will become the devices not under test. The switching of devices in and out of test is done by switching array 20.

Switching array 20 includes gate switches 46, 48, 50, and 52 connected to the gate terminals of transistors 40, 42, 14 and 44, respectively. Switching array 20 also includes drain switches 60, 62, 64, and 66 which are connected to the drains of transistors 40, 42, 14 and 44, respectively. In the example shown, gate switch 50 and drain switch 64 are closed so as to enable DUT 14, which is the device under test, by connecting it to ID 18 and output node 16. Gate switches 46, 48, and 52 and drain switches 60, 62, and 66 of the devices not under test (i.e. transistors 40, 42, and 44) are opened to disconnect these transistors from ID 18 and output node 16. In addition, the gates of the devices not under test may be connected to 0V in case of an N-type device and to the supply voltage in case of P-type device to disable these devices.

Leakage current compensator 22 includes operational amplifier 70 with its non-inverting terminal 72 connected directly (i.e., over a low-resistance path) to output node 16. The inverting terminal 74 and output terminal of operational amplifier 70 are connected to the drains of transistors 40, 42, 14, and 44 via switches 80, 82, 84, 86, respectively, of the switching array 20. In the example shown, switches 80, 82, and 86 are closed to connect the drains of transistors 40, 42, and 44 not under test to the inverting input terminal 74 and the output terminal 76 of operational amplifier 70. Switch 84 is opened to disconnect drain of DUT 14 under test from the inverting input terminal 74 and the output terminal 76 of operational amplifier 70.

Figure 4:
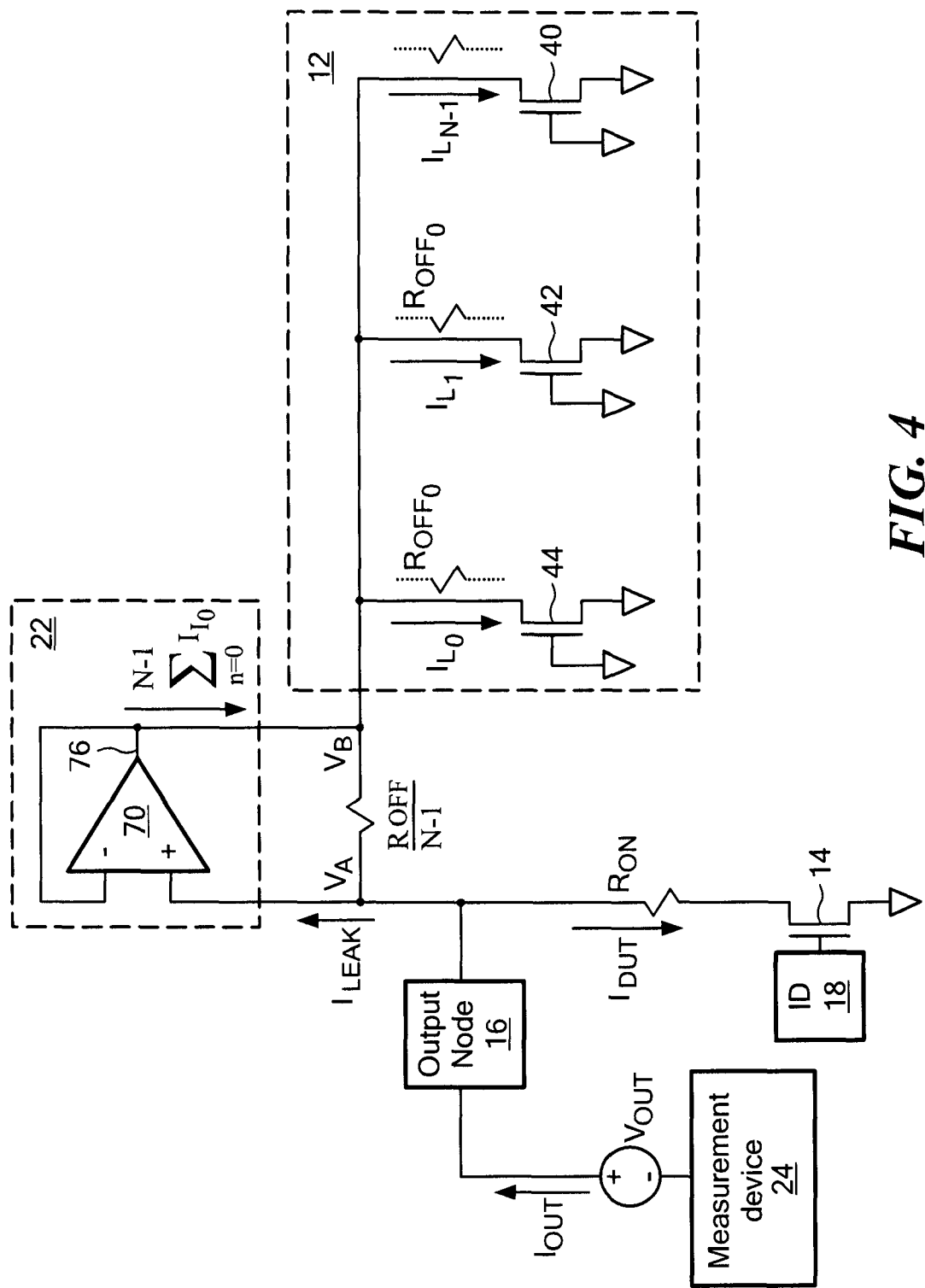
FIG. 4 is an equivalent circuit of the circuit for testing a plurality of semiconductor devices.

In FIG. 4 there is shown an equivalent circuit to circuit 10 of FIG. 3 to more readily explain the operation of the leakage current compensator 22. The effective resistance of the switches that are between drains of devices not under test and the output is equal to Rtotal, which is the reciprocal of the sum of the inverses of the individual resistances $Roff_0$, $Roff_1$, $Roff_{N-1}$. N is the total number of switches which connect the drains (second terminal) of all the devices that need to be tested to the output node. All the switches are the same, thus they have the same Roff. In the embodiment of FIG. 3 there are four semiconductor devices to be tested, with three not under test while one device is under test. The total number of devices to be tested in a particular IC could be much higher, for example, five hundred or more semiconductor devices.

The effective resistance of all the switches that are off is given by:

$$\frac{1}{R_{total}} = \frac{1}{R_{OFF0}} + \frac{1}{R_{OFF1}} + \ldots + \frac{1}{R_{OFF(N-1)}}$$

$$R_{total} = \frac{R_{off}}{N-1}$$

Total current measured at the output is:

$$I_{OUT} = I_{LEAK} + I_{DUT}$$

The leakage current is given by:

$$I_{LEAK} = \frac{V_A - V_B}{R_{total}}$$

$$I_{LEAK} = \frac{V_A - V_B}{\left(\frac{R_{off}}{N-1}\right)}$$

Operational amplifier 70 of leakage current compensator 22 functions as a voltage follower and matches the voltage at the output node 16, $V_A$, to that at the drains of the transistors not under test, $V_B$. Since $V_A - V_B$ is maintained close to zero by the follower, $I_{LEAK}$ will be close to zero at the output node 16 and the output current, $I_{OUT}$, will be substantially equal to the test current, $I_{DUT}$.

Therefore, leakage current compensator 22 has the effect of diverting the leakage current from the output node 16 through the devices not under test as depicted in FIG. 3, as leakage currents $I_{L0}$, $I_{L1}$, and $I_{L2}$ and in FIG. 4 as leakage currents $I_{L0}$, $I_{L1}$, and $I_{LN-1}$. Other circuits implementing the leakage compensator 22 (other than an operational amplifier follower circuit) could be used, as along as the function of that circuit is to compensate for the current needed to maintain a near zero voltage between output node 16 and a point within the switching array 20 corresponding to the opposite end of an equivalent load of the devices not under test.

There is an additional amount of leakage current that can also be accounted for and removed from the output current to further increase the accuracy of the test current. This current is called the uncompensated leakage current, $I_{UNCOMP}$, and is not removed by the leakage current compensator 22. With the leakage current compensator 22 active, the output current is represented by the following equation:

$$I_{OUT} = I_{DUT} + I_{UNCOMP}$$

The uncompensated current can be determined by way of a calibration process. Referring to FIG. 3, there is shown an ID switch 90 and an open circuit switch 92. To measure the uncompensated leakage current, open circuit switch 92 is closed to connect the output node 16 to an open circuit terminal 94. In addition, drain switches 80, 82, 84, and 86 are closed to connect operational amplifier 70 to transistors 40, 42, 44, and 14. ID switch 90, as well as all other switches in switching array 20, are opened. The uncompensated leakage current at the output node 16 is then measured by measurement device 24 and subtracted from the test current measurements (e.g. during post processing) to further improve measurement accuracy of circuit 10.

Figure 5:
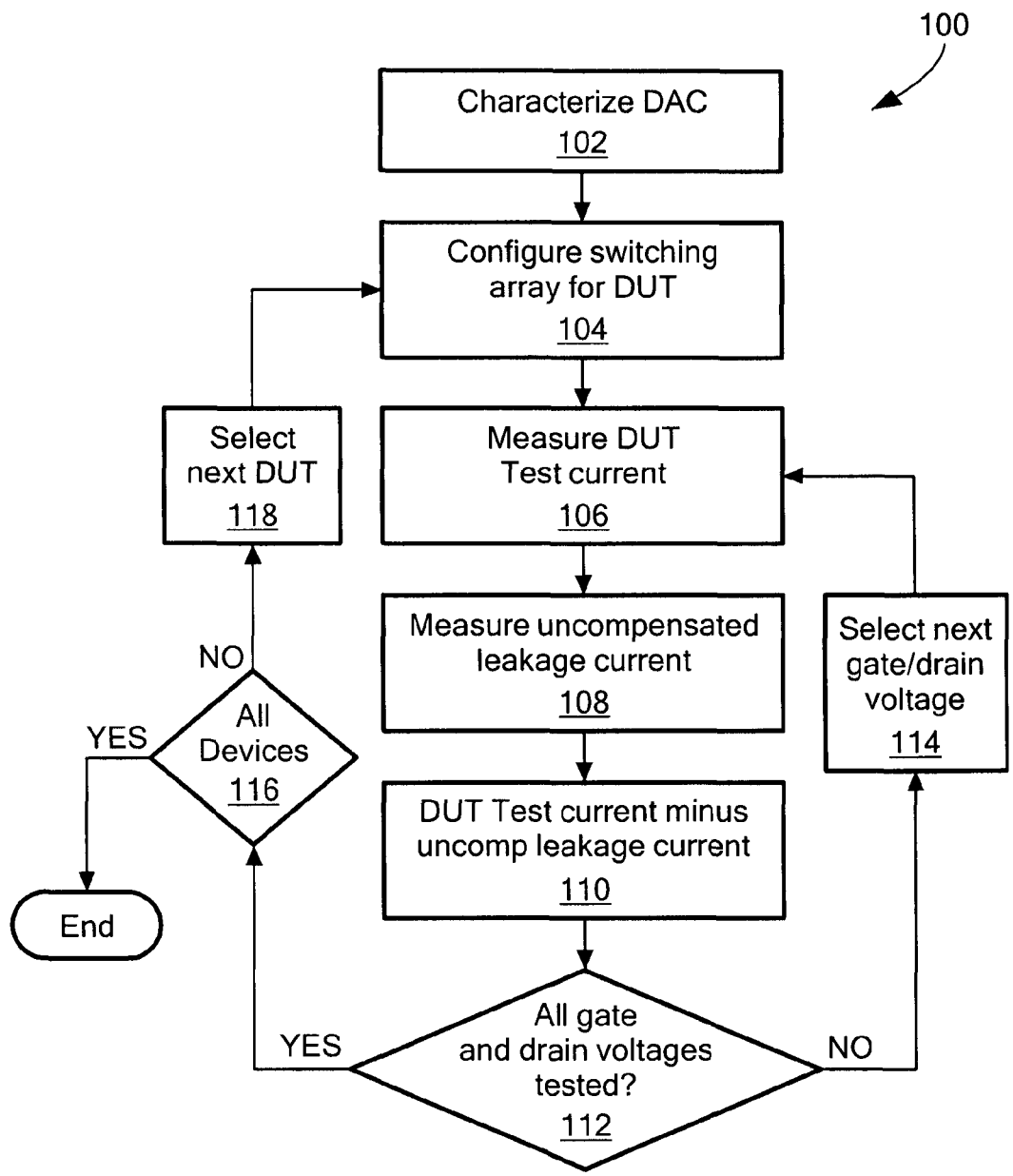
FIG. 5 is a flow chart depicting the operation of the circuit for testing a plurality of semiconductor devices.

The operation of circuit 10 is described with regard to flow chart 100 in FIG. 5. At step 102, ID 18 is characterized to account for nonlinearities in the ID 18 (e.g., nonlinearities in the passive DAC used to implement ID 18). This is done by closing ID switch 90 to the output node 16 and closing drain switches 80, 82, 84, and 86. By characterizing the DAC, the actual voltages that will be seen at the gates of the DUT are determined.

In step 104, the first device to undergo testing is selected and switching array 20 is configured for testing the selected device. Each device to be tested is tested at a plurality of gate and drain voltage levels. At step 106 the test current for the device under test is measured at a first of the plurality of gate and drain voltages and step 108 the uncompensated leakage current is measured. The final test current is determined at step 110 by subtracting from the test current measured at step 106 the uncompensated leakage current measured at step 108.

At step 112 it is determined if all of the plurality of gate and drain voltages have been tested for the device under test. If all of the voltages have not been tested, at step 114 the next gate/drain voltage is selected and the test current measurement for the current device under test continues at step 106. If at step 112 it is determined that all of the plurality of gate and drain voltages have been tested for the device under test, the process continues to step 116 where it is determined if there is another device still to test and if there is not, the process ends. If there is another device to test the process continues to step 118 where the next device under test is selected and then the process continues on to step 104.

The test voltages and current data for the devices may then be analyzed according to known methods to assess the electrical performance of the IC under test.

Other embodiments are within the scope of the following claims.

What is claimed is:

1. An apparatus, comprising:
   a plurality of semiconductor devices;
   an electrical input device for applying voltage to said plurality of semiconductor devices;
   a switching array configured to sequentially interconnect said electrical input device to each of said plurality of semiconductor devices and disconnect the other semiconductor devices from said electrical input device, a semiconductor device connected to the electrical input device being a device under test that produces a test current and the other semiconductor devices being devices not under test that, in the aggregate, produce a leakage current;
   an output node interconnected to the switching array for enabling the measurement of the test current at the output node; and
   a leakage current compensator connected to the output node and the switching array, the leakage current compensator configured to divert the leakage current away from the output node.

2. The apparatus of claim 1, wherein said plurality of semiconductor devices comprise at least one of transistors, diodes, or resistors.

3. The apparatus of claim 1, wherein said electrical input device includes a passive digital-to-analog converter.

4. The apparatus of claim 1, wherein said switching array includes, for each of said plurality of semiconductor devices, a first switch for connecting a first terminal of a semiconductor device to said electrical input device and a second switch for connecting a second terminal of a semiconductor device to said output node.

5. The apparatus of claim 4, wherein the first and second switches of the device under test are closed to connect the first terminal of the device under test to said electrical input device and the second terminal of the device under test to said output node, and the first and second switches of said devices not under test are opened to disconnect the first terminal of each of the devices not under test from said electrical input device and to disconnect the second terminal of each of the devices not under test from said output node.

6. The apparatus of claim 5, wherein said devices not under test are disabled by applying a predetermined voltage to the first terminals of said devices not under test.

7. The apparatus of claim 5, wherein the switching array further includes a switch for connecting the leakage current compensator to the second terminal of each of said plurality of semiconductor devices, and wherein the switch for connecting the leakage current compensator to the device under test is opened to disconnect the leakage current compensator from the second terminal of the device under test and the switches for connecting the leakage current compensator to the devices not under test are closed to connect the leakage current compensator to the second terminals of the devices not under test.

8. The apparatus of claim 7, wherein the leakage current compensator is configured to maintain a voltage at the second terminals of the devices not under test close to a voltage at the output node.

9. The apparatus of claim 8, wherein the leakage current compensator includes a voltage follower circuit configured to maintain the voltage at the second terminals of the devices not under test close to the voltage at the output node.

10. The apparatus of claim 9, wherein the voltage follower circuit includes an operational amplifier with its non-inverting terminal connected to the output node and both the inverting terminal and the output connected to the switching array.

11. The apparatus of claim 1, wherein the switching array further includes an uncompensated leakage current circuit that comprises a switch connected between the output node and an open circuit terminal.

12. The apparatus of claim 11, further comprising a measurement device connected to the output node, wherein the measurement device is configured to measure an uncompensated leakage current at the output node when the switch of the uncompensated leakage current circuit is closed.

13. The apparatus of claim 1, wherein the switching array further includes an electrical input device switch for connecting the electrical input device to the output node, wherein the electrical input device is configured to apply voltages in a test mode to the output node, and wherein there is also included a measurement circuit connected to the output node configured to measure the voltages and currents at the output node and configured to measure nonlinearities associated with the electrical input device.

14. The apparatus of claim 1, wherein the leakage compensator includes a voltage follower circuit configured maintain a voltage at terminals of the devices not under test close to a voltage at the output node.

15. A method for testing a plurality of semiconductor devices, the method comprising:
   sequentially applying voltage from an electrical input device to each of said plurality of semiconductor devices, a semiconductor device to which voltage is applied being a device under test, said device under test producing a test current;

preventing voltage from being applied by the electrical input device to other semiconductor devices not under test, the devices not under test producing, in the aggregate, a leakage current;

receiving the test current for measurement at an output node; and diverting the leakage current away from the output node.

16. The method of claim 15, wherein said sequentially applying the voltage from the electrical input device and said preventing voltage from being applied by the electrical input device to said semiconductor devices not under test includes operating a plurality of switches including, for each of said plurality of semiconductor devices, a first switch for connecting a first terminal of a semiconductor device to said electrical input device and a second switch for connecting a second terminal of a semiconductor device to said output node.

17. The method of claim 16, wherein said plurality of semiconductor devices comprise at least one of transistors, diodes, or resistors.

18. The method of claim 16, further comprising closing the first and second switches of the device under test to connect the first terminal of the device under test to said electrical input device and the second terminal of the device under test to said output node and opening the first and second switches of said devices not under test to disconnect the first terminal of each of the devices not under test from said electrical input device and the second terminal of each of the devices not under test from said output node.

19. The method of claim 18, further comprising operating a switch connected to the leakage current compensator and to the second terminal of each of said plurality of semiconductor devices, the operating including opening the switch to disconnect the leakage current compensator from the second terminal of the device under test and closing the switches for connecting the leakage current compensator to the devices not under test.

20. The method of claim 19, further comprising disabling said devices not under test by applying a predetermined voltage to the first terminals of said devices not under test.

21. The method of claim 19, further comprising causing the leakage current compensator to maintain a voltage at the second terminals of the devices not under test close to a voltage at the output node, thereby diverting the leakage current away from the output node.

22. The method of claim 15, further comprising determining an uncompensated leakage current.

23. The method of claim 22, further comprising measuring the test current and subtracting from the test current the uncompensated leakage current.

24. The method of claim 15, further comprising, connecting the electrical input device to the output node, and with the electrical input device applying voltages to the output node, measuring the voltages and currents at the output node, and from the measured voltages determining if there are nonlinearities associated with the electrical input device.

25. The method of claim 15, wherein diverting the leakage current away from the output node includes maintaining a voltage at terminals of the devices not under test close to a voltage at the output node.

* * * * *